(12) United States Patent
Liu et al.

(10) Patent No.: US 12,264,749 B2
(45) Date of Patent: Apr. 1, 2025

(54) FLOW CONTROL EQUIPMENT AND AUTOMATIC REFILLING SYSTEM

(71) Applicant: CHANGXIN MEMORY TECHNOLOGIES, INC., Hefei (CN)

(72) Inventors: Bo Liu, Hefei (CN); Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 398 days.

(21) Appl. No.: 17/807,020

(22) Filed: Jun. 15, 2022

(65) Prior Publication Data

US 2023/0223288 A1    Jul. 13, 2023

Related U.S. Application Data

(63) Continuation of application No. PCT/CN2022/081507, filed on Mar. 17, 2022.

(30) Foreign Application Priority Data

Jan. 10, 2022  (CN) .......................... 202210020964.7

(51) Int. Cl.
*F16K 3/08*  (2006.01)
*B29C 64/124*  (2017.01)
(Continued)

(52) U.S. Cl.
CPC ............ *F16K 3/085* (2013.01); *B29C 64/124* (2017.08); *B29C 64/364* (2017.08); *B41F 13/22* (2013.01); *B41F 23/0476* (2013.01); *F16K 3/32* (2013.01); *F16K 3/34* (2013.01); *G05D 9/12* (2013.01); *H01L 21/67276* (2013.01); *B33Y 30/00* (2014.12); *B33Y 50/02* (2014.12)

(58) Field of Classification Search
CPC .. F16K 3/32; F16K 3/34; F16K 3/085; G05D 9/12; B41F 13/22; B41F 23/0476
See application file for complete search history.

(56) References Cited

U.S. PATENT DOCUMENTS

2017/0356552 A1* 12/2017 Cassel .................. F16K 31/535

FOREIGN PATENT DOCUMENTS

| CN | 102230170 A | 11/2011 |
| CN | 202181228 U | 4/2012 |

(Continued)

OTHER PUBLICATIONS

International Search Report cited in PCT/CN2022/081507 mailed Oct. 10, 2022, 9 pages.

*Primary Examiner* — Atif H Chaudry
(74) *Attorney, Agent, or Firm* — Kilpatrick Townsend & Stockton LLP (57) ABSTRACT

The present disclosure provides a flow control equipment and an automatic refilling system. The flow control equipment includes: a housing, including a discharge hole in a bottom of the housing; a liquid inlet tube connecting with a top of the housing; a motor located in the housing; a flow locking blade and a plurality of flow control blades connected to the motor, where leakage holes of different sizes are formed in the flow control blades, and the motor drives the flow control blades and the flow locking blade to rotate to align the different leakage holes with the discharge hole, or to seal the discharge hole; and a liquid outlet tube connecting with the discharge hole.

12 Claims, 4 Drawing Sheets

(51) Int. Cl.
*B29C 64/364* (2017.01)
*B41F 13/22* (2006.01)
*B41F 23/04* (2006.01)
*F16K 3/32* (2006.01)
*F16K 3/34* (2006.01)
*G05D 9/12* (2006.01)
*H01L 21/67* (2006.01)
*B33Y 30/00* (2015.01)
*B33Y 50/02* (2015.01)

(56) References Cited

FOREIGN PATENT DOCUMENTS

| | | | | |
|---|---|---|---|---|
| CN | 205421415 U | * | 8/2016 | |
| CN | 105937628 A | * | 9/2016 | |
| CN | 208719408 U | | 4/2019 | |
| CN | 110260022 A | | 9/2019 | |
| CN | 111527837 A | | 8/2020 | |
| CN | 211574304 U | | 9/2020 | |
| CN | 211998906 U | | 11/2020 | |
| CN | 213332468 U | | 6/2021 | |
| CN | 215003128 U | * | 12/2021 | |

* cited by examiner

FLOW CONTROL EQUIPMENT AND AUTOMATIC REFILLING SYSTEM

CROSS-REFERENCE TO RELATED APPLICATIONS

This is a continuation of International Application No. PCT/CN2022/081507, filed on Mar. 17, 2022, which claims the priority to Chinese Patent Application No. 202210020964.7, filed with the China National Intellectual Property Administration (CNIPA) on Jan. 10, 2022, the entire contents of both of which are incorporated herein by reference.

TECHNICAL FIELD

The present disclosure relates to semiconductor lithography equipment, and in particular to a flow control equipment and an automatic refilling system.

BACKGROUND

A lens cooling water cabinet (LCWC) provides cooling water for a main machine table to ensure normal operation of the machine table. With the consumption of the cooling water, there is a constantly decreasing water level in the LCWC. When the water level is lower than a refilling interface, the system sends a refilling signal to remind an operator to refill the water manually on the site.

However, the manual refilling is prone to a fast refilling velocity, and drastic fluctuation of the water temperature, which affects the normal operation of the machine table. It takes 3-5 h for the machine to enter a production state again, causing a certain productivity loss.

SUMMARY

Embodiments of the present disclosure provide a flow control equipment and an automatic refilling system.

According to a first aspect, an embodiment of the present disclosure provides a flow control equipment, including: a housing, including a discharge hole, the discharge hole being in a bottom of the housing; a liquid inlet tube connecting with a top of the housing; a motor located in the housing; a flow locking blade and a plurality of flow control blades connected to the motor, where leakage holes of different sizes are formed in the flow control blades, and the motor drives the flow control blades and the flow locking blade to rotate to align the different leakage holes with the discharge hole, or to seal the discharge hole; and a liquid outlet tube connecting with the discharge hole.

According to a second aspect, an embodiment of the present disclosure provides an automatic refilling system, including the flow control equipment described above; a liquid supply equipment connected to the liquid inlet tube, and configured to provide a liquid; a controller connected to the flow control equipment, and configured to control the motor to rotate the flow locking blade or the flow control blades to a position above the discharge hole; a liquid buffering groove connected to the liquid outlet tube; and a liquid tank located below the liquid buffering groove, and configured to accommodate the liquid.

Details of one or more embodiments of the present disclosure will be illustrated in the following drawings and description. Other features, objectives, and advantages of the is present disclosure become evident in the specification, claims, and accompanying drawings.

BRIEF DESCRIPTION OF THE DRAWINGS

To describe the technical solutions in the embodiments of the present disclosure more clearly, the accompanying drawings required to describe the embodiments are briefly described below. Apparently, the accompanying drawings described below are only some embodiments of the present disclosure. Those of ordinary skill in the art may further obtain accompanying drawings of other embodiments based on these accompanying drawings without creative efforts.

DETAILED DESCRIPTION

To facilitate the understanding of the present disclosure, the present disclosure is described more completely below with reference to the related accompanying drawings. Preferred embodiments of the present disclosure are shown in the drawings. However, the present disclosure may be embodied in various forms without being limited to the embodiments described herein. On the contrary, these embodiments are provided to make the present disclosure understand more thorough and comprehensive.

Unless otherwise defined, all technical and scientific terms used herein have the same meaning as commonly understood by those skilled in the technical field of the present disclosure. The terms used in the specification of the present disclosure are merely for the purpose of describing specific embodiments, rather than to limit the present disclosure. The term "and/or" used herein includes any and all combinations of one or more of the associated listed items.

In the description of a position relationship, unless otherwise specified, when one element, e.g., a layer or substrate, is referred to as being "on" another film layer, it can be directly located on the other film layer or there may be an intermediate film layer. Further, when a layer is referred to as being "under" another layer, it can be directly under the other layer, or there may be one or more intermediate layers. It can also be understood that, when a layer is referred to as being "between" two layers, it may be the only layer between the two layers, or other may be one or more intermediate layers. The terms "on" and "under" used herein refer to an extent of proximity to the user relative to a tactile feedback module in applications. The side close to the user is referred to as "on", while the side away from the user is referred to as "under".

In a case where terms "include", "have", and "contain" in the specification are used, unless clear qualifiers such as "only" and "consist of" are used, another component can be added. Unless the contrary is mentioned, terms in the singular form may include the plural form but are not to be understood as a single one.

In the present disclosure, unless otherwise clearly specified, the terms "connected with" and "connected to" should be understood in a broad sense. For example, the connection may be a fixed connection, a detachable connection or an integrated connection, may be a direct connection or an indirect connection via an intermediate medium, or may be interconnection between two components. Those of ordinary skill in the art should understand the specific meanings of the above terms in the present disclosure based on specific situations.

In addition, in the description of the present disclosure, the terms "multiple", "one another", "overlap", "stacked" and "a plurality of" refer to two or more, unless otherwise specified.

Figure 1:
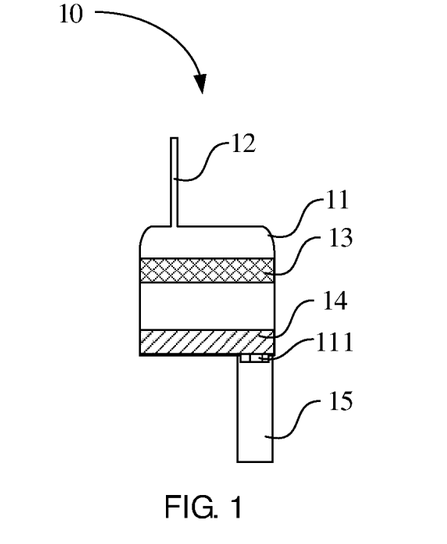
FIG. 1 is a schematic structural diagram of a flow control equipment according to an embodiment of the present disclosure.
Figure 2:
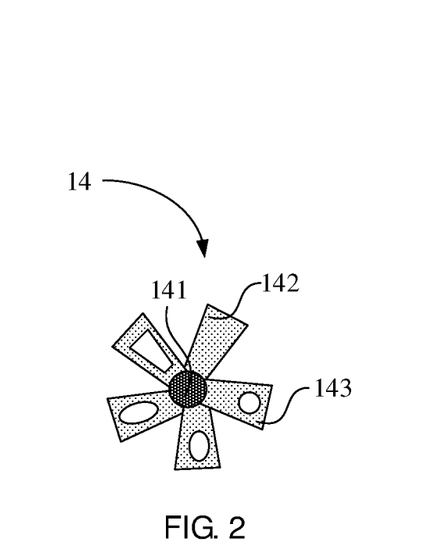
FIG. 2 is a schematic structural diagram of a flow limiter according to an embodiment of the present disclosure.

As shown in FIG. 1 and FIG. 2, an embodiment of the present disclosure provides a flow control equipment 10. The flow control equipment 10 may be configured to control a liquid flow. For example, the flow control equipment 10 may be applied to a refilling system of the LCWC to adjust and control the refilling velocity of cooling water for the machine table. Exemplarily, the flow control equipment 10 may include: a housing 11 including a discharge hole 111 in a bottom of the housing 11; a liquid inlet tube 12 connecting with a top of the housing 11; a motor 141 located in the housing 11; a flow locking blade 142 and a plurality of flow control blades 143 connected to the motor 141, where leakage holes of different sizes are formed in the flow control blades 143, and the motor 141 drives the flow control blades 143 and the flow locking blade 142 to rotate to align the different leakage holes with the discharge hole 111, or to seal the discharge hole 111; and a liquid outlet tube 15 connecting with the discharge hole 111.

The motor 141, the flow locking blade 142 and the flow control blades 143 form a flow limiter 14, as shown in FIG. 2. Exemplarily, the motor 141 may be a micromotor. The motor 141 may drive the flow control blades 143 to rotate to align the leakage holes of the different sizes with the discharge hole 111, thereby adjusting the liquid flow. For example, when there is a need to decrease the liquid flow, the motor 141 may drive the flow control blades 143 to rotate a small leakage hole to a position above the discharge hole 111. When there is a need to increase the liquid flow, the motor 141 may drive the flow control blades 143 to rotate a large leakage hole to the position above the discharge hole 111.

Exemplarily, the leakage holes on the flow control blades 143 may have a same shape or different shapes. For example, the leakage holes may be of a circular shape, an elliptical shape or a trapezoidal shape. From a smallest leakage hole, areas of the leakage holes may be increased progressively. The adjustment accuracy of the flow control equipment 10 depends on the area increased each time. The number of the flow control blades 143 can be determined by the operator according to actual needs to achieve a balance between the cost and the accuracy. Exemplarily, if there is a need to is stop the refilling operation, the flow locking blade 142 may be rotated to the position above the discharge hole 111 to completely seal the discharge hole 111. In this case, the liquid flow is zero, and the refilling process is ended.

In other embodiments, the flow locking blade and the flow control blades may form an integral blade structure. A plurality of leakage holes having different sizes are formed in the integral blade structure, with a difference between sectional areas of adjacent leakage holes determining the accuracy of the flow control equipment. In this case, the operator controls the motor as required to drive the integral blade structure, such that the corresponding leakage hole connects with the discharge hole to refill the liquid. A flow locking region is reserved in the integral blade structure. Upon the completion of the refilling operation, the motor is controlled continuously to drive the integral blade structure to rotate, such that the flow locking region is located above the discharge hole to seal the discharge hole.

By aligning the leakage holes of the different sizes to the discharge hole 111, the flow control equipment 10 adjusts the liquid flow at a small variation, and refills the liquid more gently, thereby preventing the temperature fluctuation of the machine table due to a large variation of the liquid flow, and alleviating influences of the refilling operation on productivity of the machine table.

In an embodiment, referring also to FIG. 1, the housing 11 of the flow control equipment 10 is further provided with a filter membrane 13, which is located above the motor 141 and the flow control blades 143.

Exemplarily, the filter membrane 13 may use a polypropylene (PP) cotton element for filtering foreign matters in the liquid. The filter membrane 13 above the flow control blades 143 can buffer the liquid entering the flow control equipment 10 to decrease a flow velocity of the liquid.

Figure 3:
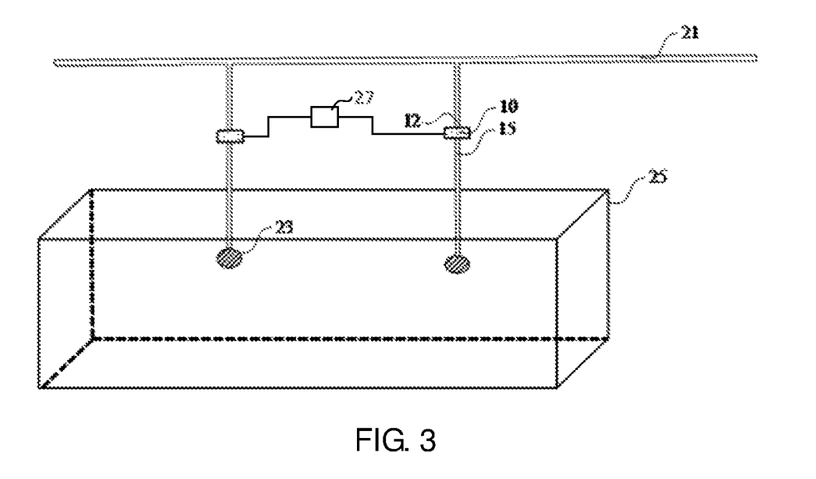
FIG. 3 is a schematic structural diagram of an automatic refilling system according to an embodiment of the present disclosure.

An embodiment of the present disclosure further provides an automatic refilling system, as shown in FIG. 3. Specifically, the automatic refilling system includes: the flow control equipment 10 described above; a liquid supply equipment 21 connected to the liquid inlet tube 12, and configured to provide a liquid; a controller 27 connected to the flow control equipment 10, and configured to control the motor 141 to rotate the flow is locking blade 142 or the flow control blades 143 to a position above the discharge hole 111; a liquid buffering groove 23 connected to the liquid outlet tube 15; and a liquid tank 25 located below the liquid buffering groove 23, and configured to accommodate the liquid.

Exemplarily, the liquid supply equipment 21 may be a water supply line of the factory side, and may be configured to provide purified water for the automatic refilling system. Optionally, the liquid supply equipment 21 may further provide other liquids such as chemical reagents.

The embodiment takes the case where the liquid supply equipment 21 provides the purified water for the automatic refilling system as an example for description. As shown in FIG. 3, the liquid supply equipment 21 is connected to the liquid inlet tube 12 of the flow control equipment 10. The purified water flows to the flow control equipment 10 for first buffering, flows to the liquid buffering groove 23 through the liquid outlet tube 15 for second buffering and flows into the liquid tank 25. For water buffered twice and flowing into the liquid tank 25, there are significantly decreased flow velocity and impact force to alleviate influences on the water temperature in the liquid tank 25.

During the whole refilling process, the liquid flow is adjusted by the controller 27. The controller 27 is connected to the flow control equipment 10 to control rotation of the motor 141. The motor 141 drives the flow locking blade 142 or the flow control blade 143 to rotate to the position above the discharge hole 111. Exemplarily, different flow control blades 143 correspond to different liquid flows. By controlling the liquid flow within a small range, the automatic refilling system can prevent excessive water injection into the liquid tank 25 within a short time and prevent large fluctuation of the water temperature.

With the controller 27 and the flow control equipment 10, the automatic refilling system can accurately control and adjust the liquid flow entering the liquid tank 25, which prevents the temperature fluctuation of the liquid due to a large liquid flow during the refilling operation from affecting the normal operation of the machine table. Meanwhile, with the liquid buffering groove 23, the automatic refilling system can implement secondary buffering on the liquid and prevent the large temperature fluctuation of the liquid in the liquid tank 25 during the refilling operation.

Figure 4A:
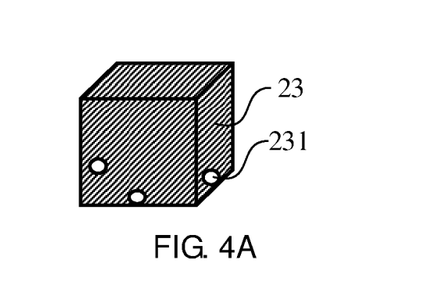
FIG. 4A and FIG. 4B each are a schematic structural diagram of a liquid buffering groove according to an embodiment of the present disclosure.
Figure 4B:
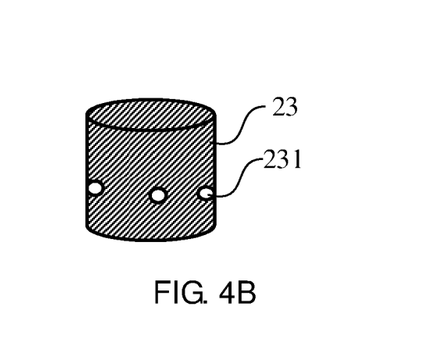

In an embodiment, as shown in FIG. 4A and FIG. 4B, the liquid buffering groove 23 may be of a cylinder and a cube. Optionally, the liquid buffering groove 23 may further be of a spheroid or an ellipsoid. Exemplarily, the liquid buffering groove 23 may be made of a stainless steel material, with corrosion resistance and high cleanliness.

In an embodiment, there is one or more liquid buffering grooves 23 and one or more flow control equipment 10. As an example, the number of the liquid buffering grooves 23 is the same as that of the flow control equipment 10, and the liquid buffering grooves 23 are in one-to-one correspondence with the flow control equipment 10. Optionally, there may be one flow control equipment 10 and a plurality of the liquid buffering grooves 23. In the flow control equipment 10, there are a plurality of liquid outlet tubes 15 that are separately connected to the liquid buffering grooves 23. As a result, the liquid is dispersed to the liquid buffering grooves 23 for buffering and then flows to the liquid tank 25, thereby enhancing the buffering effect. Optionally, there may be a plurality of the flow control equipment 10 and one liquid buffering groove 23. The number of the liquid buffering grooves 23 and the number of the flow control equipment 10 are not limited in the present disclosure.

By adjusting the number of the liquid buffering grooves 23 and the number of the flow control equipment 10, different refilling solutions may be designed for different refilling requirements.

Figure 5:
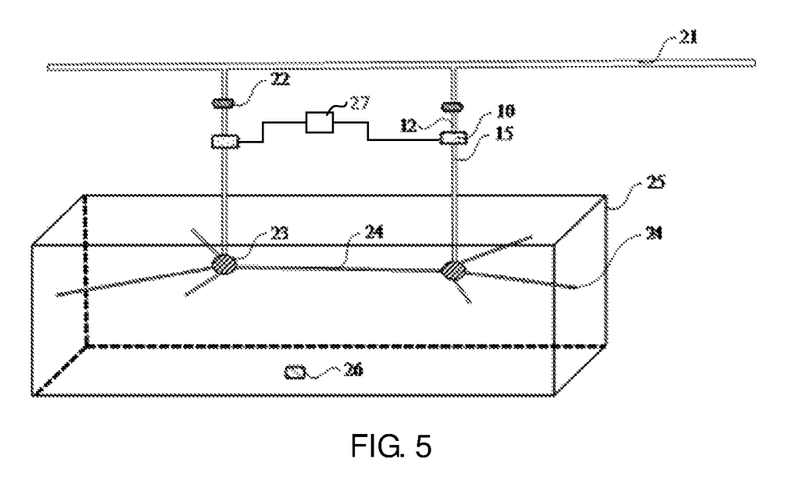
FIG. 5 is a schematic structural diagram of an automatic refilling system according to another embodiment of the present disclosure.

In an embodiment, as shown in FIG. 4A and FIG. 4B, a plurality of drainage holes 231 having a same height or different heights may be formed in a bottom or a sidewall of the liquid buffering groove 23. As shown in FIG. 5, the automatic refilling system further includes a plurality of drainage tubes 24. The drainage tubes 24 are connected to the drainage holes 231, and configured to drain the liquid in the liquid buffering groove 23 to a sidewall of the liquid tank 25.

Exemplarily, the drainage tubes 24 may be made of a stainless steel material to obtain higher corrosion resistance and higher cleanliness.

Exemplarily, as shown in FIG. 4A and FIG. 4B, the cylindrical liquid buffering groove 23 may have a height of 20-50 mm, such as 20 mm, 30 mm, 40 mm or 50 mm, and may have a diameter of 20-40 mm, such as 20 mm, 30 mm or 40 mm. Exemplarily, the cubic cylindrical liquid buffering groove 23 may have a side length of 20-50 mm, such as 20 mm, 30 mm, 40 mm or 50 mm.

Exemplarily, as shown in FIG. 5, the drainage holes 231 are connected to the drainage tubes 24 to drain the liquid to the sidewall of the liquid tank 25. The heights of the drainage holes 231 may be the same, and may also be different. As an example, distances from the drainage holes 231 to the bottom of the liquid tank may be in a range of 0-10 mm.

As an example, the drainage holes 231 have the different heights. By providing the drainage holes 231 at the different heights, the liquid in the liquid buffering groove 23 can be discharged in stages to buffer the liquid flow. Meanwhile, the liquid is drained to the sidewall of the liquid tank 25 by the drainage tubes 24, such that the liquid flows slowly to the liquid tank 25 along the sidewall to further buffer the liquid flow and the liquid at the same flow is injected into the liquid tank 25 more slowly, thereby preventing drastic fluctuation of the water temperature, and ensuring the normal operation of the machine table during the refilling operation.

In an embodiment, the drainage holes 231 have a same diameter or different diameters. The drainage tubes 24 are matched with the drainage holes 231 in diameter. By adjusting the diameters of the drainage holes 231 and matching the corresponding drainage tubes 24 with the drainage holes 231, more abundant refilling solutions can be provided to adjust the rate at which the liquid flows out of the liquid buffering groove 23.

In an embodiment, referring also to FIG. 5, the liquid buffering grooves 23 may connect through the drainage tubes 24. Exemplarily, the drainage tubes 24 connecting the liquid buffering grooves 23 are lower than other drainage tubes 24. By connecting the liquid buffering grooves 23 through the drainage tubes 24, the liquid flowing to the liquid buffering grooves 23 can be averaged. In case of a large liquid flow in some liquid buffering groove 23, the liquid entering the liquid buffering groove 23 can be drained to another liquid buffering groove 23 through the drainage tube 24, and then drained to the sidewall of the liquid tank 25 through the remaining drainage tubes 24, thereby decreasing the flow velocity of the liquid entering the liquid tank 25.

In an embodiment, referring also to FIG. 5, the automatic refilling system further includes: a flowmeter 22 provided on the liquid inlet tube 12. The flowmeter 22 is configured to acquire flow data and send the flow data to the controller 27.

Exemplarily, the flowmeter 22 may count a water amount injected into the liquid tank 25 within a time period, and send flow data to the controller 27 for storage. With the flowmeter 22 on the liquid inlet tube 12, the flow of the liquid inlet tube 12 can be obtained in real time.

In an embodiment, referring also to FIG. 5, the automatic refilling system further includes: a liquid level measurer 26 provided in the liquid tank 25. The liquid level measurer 26 is configured to measure a liquid level in the liquid tank 25 and send the liquid level to the controller 27.

Exemplarily, as shown in FIG. 5, the liquid level measurer 26 may include a piezoresistive strain gauge provided at a bottom of the liquid tank 25. Specifically, the piezoresistive strain gauge measures a hydraulic pressure value F at the bottom of the liquid tank 25. Thereafter, the liquid level in the liquid tank 25 is given by:

$$F = P \cdot s;\text{ and}$$

$$P = \rho \cdot g \cdot h.$$

In the foregoing formulas, P is the pressure, s is the area of the piezoresistive strain gauge, $\rho$ is the liquid density, g is the gravitational acceleration, and h is the liquid level.

With the liquid level measurer 26 in the liquid tank 25, the liquid level in the liquid tank 25 can be obtained in real time, thereby determining whether the liquid is refilled according to the liquid level.

In an embodiment, the controller 27 is configured to: record a variation of each of the flow data and the liquid level within a preset time period; and calculate, according to the variation of each of the flow data and the liquid level, a consumption rate and a consumption amount of the liquid within the preset time period.

Exemplarily, the cooling water is consumed constantly when the machine table is in normal operation. Therefore, without the refilling operation, the liquid level in the liquid tank 25 is decreased constantly over time. Supposing that the consumption rate of the cooling water of the machine table in the normal operation is v, a product of the time T and the consumption rate v of the cooling water of the machine table is an amount V1 of the cooling water consumed by the machine table within the time.

In case of the refilling operation, fresh cooling water is supplied constantly to the liquid tank 25 through the liquid inlet tube 12. The flow data in the liquid inlet tube 12 can be acquired in real time through the flowmeter 22. According to accumulation of the flow data in time, the controller 27 can obtain the amount V2 of the cooling water injected into the liquid tank 25 within the time T.

With V2 greater than V1 as an example, while the refilling operation is performed, the cooling water is also consumed by the machine table. After the time T, the liquid level in the liquid tank 25 is increased. The increment $\Delta h$ of the liquid level can be obtained by the liquid level measurer 26. Supposing that the liquid tank 25 has a bottom area of S, the consumption rate v of the cooling water of the machine table within the time T can be given by:

$$V2-V1=S\cdot \Delta h$$

The consumption amount V1 of the cooling water of the machine table within the time T can be given by V1=v·T.

In an embodiment, the automatic refilling system further includes a display equipment. The display equipment is configured to display information such as the consumption rate, the consumption amount, the liquid level and the flow data of the liquid, which is favorable for the user to intuitively obtain the operation status of the refilling system.

In an embodiment, there is a standard consumption rate interval of the liquid in the controller 27. The controller 27 is configured to generate an alarm signal if the consumption rate falls beyond the standard consumption rate interval.

Exemplarily, in the controller 27, there is a standard consumption rate interval for the cooling water of the machine table in normal operation. The controller 27 can compare the calculated consumption rate b with the standard consumption rate interval a-c. If the consumption rate b falls beyond the standard consumption rate interval a-c in the controller 27, the controller 27 controls an alarm equipment to send the alarm signal. For example, the liquid tank 25 may leak the water if the measured consumption rate b is greater than a maximum in the standard consumption rate interval a-c. The machine table may operate abnormally if the measured consumption rate b is less than a minimum in the standard consumption rate interval a-c.

Figure 6:
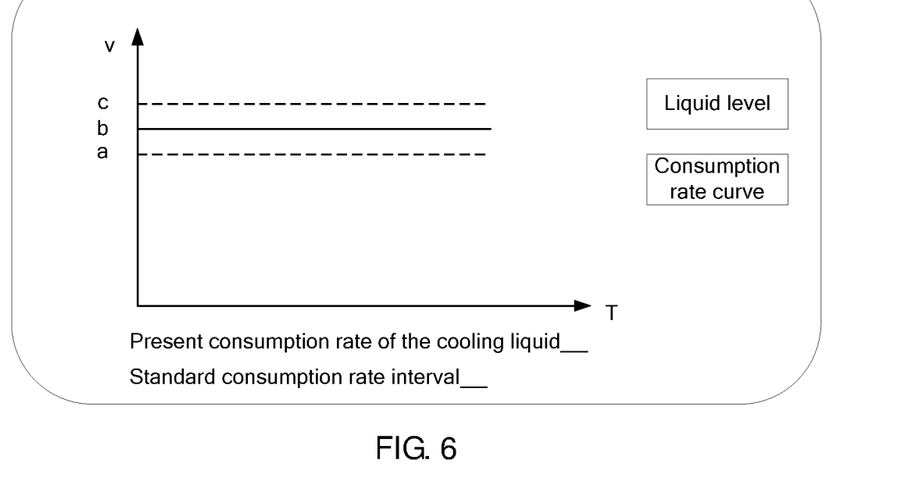
FIG. 6 is a schematic diagram of a display interface displaying a consumption rate curve according to an embodiment of the present disclosure.

Exemplarily, as shown in FIG. 6, the display interface of the display equipment may include a consumption rate curve button and a liquid level button. By clicking the consumption rate curve button and selecting the desired time interval to be queried, the user can obtain the consumption rate curve b within that time interval. Optionally, in addition to the consumption rate curve b, the display interface further displays the curve within the standard consumption rate interval a-c, such that the user intuitively determines whether the consumption rate curve b is normal. As an example, the consumption rate curve b of the cooling liquid at present has the corresponding value of 0.3 ml/min, and the standard consumption rate interval a-c is in a range of 0.28-0.32 ml/min. 0.3 ml/min falls within the range of 0.28-0.32 ml/min, which indicates that the consumption rate of the cooling liquid is normal, namely the machine table operates normally.

By providing the standard consumption rate interval, and sending the alarm signal if the consumption rate falls beyond the standard consumption rate interval, the automatic refilling system can timely remind the operator to check the refilling system, thereby improving the safety of the system, and preventing the phenomenon that the liquid tank 25 with long-time leakage is not found.

In an embodiment, there are a lower liquid level limit and an upper liquid level limit in the controller 27. The controller 27 is configured to: generate a refilling instruction if the liquid level reaches the lower liquid level limit, and send the refilling instruction to the flow control equipment 10; and generate a flow locking instruction if the liquid level reaches the upper liquid level limit, and send the flow locking instruction to the flow control equipment 10. The flow control equipment 10 is configured to rotate the flow control blade 143 to the position above the discharge hole 111 according to the refilling instruction, or rotate the flow locking blade 142 to the position above the discharge hole 111 according to the flow locking instruction.

By providing the upper liquid level limit and the lower liquid level limit, the automatic refilling system can lock the flow timely when the liquid level reaches the upper liquid level limit, or starts the refilling operation when the liquid level reaches the lower liquid level limit, thereby implementing the automatic operation without manual intervention.

Figure 7:
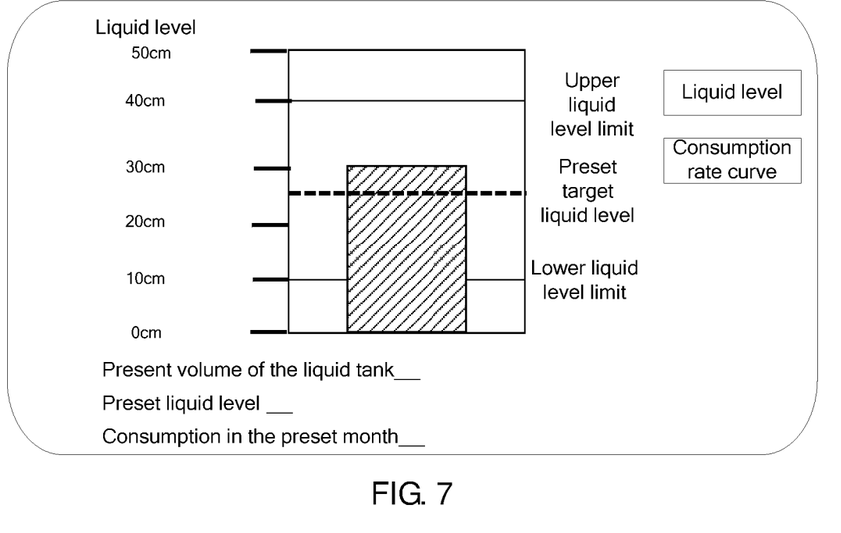
FIG. 7 is a schematic diagram of a display interface displaying a liquid level according to an embodiment of the present disclosure.

Exemplarily, as shown in FIG. 7, by clicking the liquid level button, the display interface may be switched to the schematic liquid level diagram, on which information such as the present volume of the liquid tank 25, the liquid level and the liquid consumption amount in the present month are displayed. Specifically, the upper liquid level limit and the lower liquid level limit can further be labeled on the diagram, such that the user can intuitively obtain the present liquid level and determine whether to refill the liquid or stop refilling the liquid.

In an embodiment, there is a preset target liquid level in the controller 27. The controller 27 is configured to generate a flow adjustment instruction according to the preset target liquid level, the flow data and the consumption rate, and send the flow adjustment instruction to the flow control equipment 10. The flow control equipment 10 increases or decreases a flow of the liquid based on the flow adjustment instruction, such that the liquid level is the same as or close to the preset target liquid level.

As shown in FIG. 7, the preset target liquid level is labeled by a dotted line. By providing the preset target liquid level, and adjusting the liquid flow according to the preset target liquid level, the flow data and the consumption rate, the liquid in the liquid tank 25 is always maintained around the preset target liquid level, and thus the automatic refilling system can supply the liquid to the machine table sufficiently and stably.

The technical features of the above embodiments can be employed in arbitrary combinations. To provide a concise description, all possible combinations of all technical features of the above embodiments may not be described;

however, these combinations of technical features should be construed as disclosed in this specification as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. An automatic refilling system, comprising:
a flow control equipment, wherein the flow control equipment, comprises:
a housing, comprising a discharge hole, the discharge hole being in a bottom of the housing;
a liquid inlet tube, connecting with a top of the housing;
a motor, located in the housing;
a flow locking blade and a plurality of flow control blades, connected to the motor, wherein leakage holes of different sizes are formed in the flow control blades, and the motor drives the flow control blades and the flow locking blade to rotate to align the different leakage holes with the discharge hole, or to seal the discharge hole;
a liquid outlet tube, connecting with the discharge hole;
a liquid supply equipment, connected to the liquid inlet tube, and configured to provide a liquid;
a controller, connected to the flow control equipment, and configured to control the motor to rotate the flow locking blade or the flow control blades to a position above the discharge hole;
a liquid buffering groove, connected to the liquid outlet tube; and
a liquid tank, located below the liquid buffering groove, and configured to accommodate the liquid; and, wherein
a plurality of drainage holes having a same height or different heights are formed in a bottom or a sidewall of the liquid buffering groove; and the automatic refilling system further comprises:
a plurality of drainage tubes, connected to the drainage holes, and configured to drain the liquid in the liquid buffering groove to a sidewall of the liquid tank.

2. The automatic refilling system according to claim 1, wherein
the liquid buffering groove is of a cylinder, a cube, a spheroid or an ellipsoid.

3. The automatic refilling system according to claim 1, wherein
there are one or more liquid buffering grooves and one or more flow control equipment.

4. The automatic refilling system according to claim 1, wherein
the liquid buffering grooves connect through the drainage tubes.

5. The automatic refilling system according to claim 1, further comprising:
a flowmeter, provided on the liquid inlet tube, wherein the flowmeter is configured to acquire flow data and send the flow data to the controller.

6. The automatic refilling system according to claim 5, further comprising:
a liquid level measurer, provided in the liquid tank, wherein
the liquid level measurer is configured to measure a liquid level in the liquid tank and send the liquid level to the controller.

7. The automatic refilling system according to claim 6, wherein
the liquid level measurer comprises a piezoresistive strain gauge, provided at a bottom of the liquid tank.

8. The automatic refilling system according to claim 6, wherein
the controller is configured to:
record a variation of each of the flow data and the liquid level within a preset time period; and
calculate, according to the variation of each of the flow data and the liquid level, a consumption rate and a consumption amount of the liquid within the preset time period.

9. The automatic refilling system according to claim 8, wherein
there is a standard consumption rate interval of the liquid in the controller; and
the controller is configured to generate an alarm signal when the consumption rate falls beyond the standard consumption rate interval.

10. The automatic refilling system according to claim 8, wherein
there is a preset target liquid level in the controller; and
the controller is configured to:
generate a flow adjustment instruction according to the preset target liquid level, the flow data and the consumption rate, and send the flow adjustment instruction to the flow control equipment; and
the flow control equipment increases or decreases a flow of the liquid based on the flow adjustment instruction, such that the liquid level is the same as or close to the preset target liquid level.

11. The automatic refilling system according to claim 8, further comprising:
a display equipment, connected to the controller, wherein
the display equipment is configured to display the flow data, the liquid level, the consumption rate and the consumption amount.

12. The automatic refilling system according to claim 6, wherein
there are a lower liquid level limit and an upper liquid level limit in the controller; and the controller is configured to:
generate a refilling instruction when the liquid level reaches the lower liquid level limit, and send the refilling instruction to the flow control equipment; and
generate a flow locking instruction when the liquid level reaches the upper liquid level limit, and send the flow locking instruction to the flow control equipment; and
the flow control equipment is configured to:
rotate the flow control blades to the position above the discharge hole according to the refilling instruction, or rotate the flow locking blade to the position above the discharge hole according to the flow locking instruction.

* * * * *